United States Patent
Kirkpatrick et al.

(10) Patent No.: US 12,480,215 B2
(45) Date of Patent: Nov. 25, 2025

(54) INTEGRATEAD WET CLEAN FOR BEVEL TREATMENTS

(71) Applicant: Applied Materials, Inc., Santa Clara, CA (US)

(72) Inventors: Brian K. Kirkpatrick, Allen, TX (US); Balasubramanian's Pranatharthiharan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 390 days.

(21) Appl. No.: 17/865,803

(22) Filed: Jul. 15, 2022

(65) Prior Publication Data

US 2023/0021398 A1    Jan. 26, 2023

Related U.S. Application Data

(60) Provisional application No. 63/224,580, filed on Jul. 22, 2021.

(51) Int. Cl.

| | |
|---|---|
| *C23F 1/08* | (2006.01) |
| *B08B 3/04* | (2006.01) |
| *C23C 16/52* | (2006.01) |
| *C23C 16/56* | (2006.01) |
| *C23F 1/02* | (2006.01) |
| *H01L 21/67* | (2006.01) |

(52) U.S. Cl.
CPC ............... *C23F 1/08* (2013.01); *B08B 3/04* (2013.01); *C23C 16/52* (2013.01); *C23C 16/56* (2013.01); *C23F 1/02* (2013.01); *H01L 21/67161* (2013.01); *H01L 21/67184* (2013.01)

(58) Field of Classification Search
CPC ..... C23F 1/08; C23F 1/02; B08B 3/04; C23C 16/52; C23C 16/56; H01L 21/67161; H01L 21/67184; H01L 21/67178
USPC .............................................................. 216/2
See application file for complete search history.

(56) References Cited

U.S. PATENT DOCUMENTS

| | | | |
|---|---|---|---|
| 2004/0229470 A1* | 11/2004 | Rui ................... | H01L 21/31138 257/E21.256 |
| 2010/0055924 A1* | 3/2010 | Ganesan ............. | H01L 21/6708 257/E21.228 |
| 2018/0211833 A1* | 7/2018 | Li ......................... | C23C 16/458 |
| 2018/0308729 A1* | 10/2018 | Choi .................. | H01L 21/67207 |

* cited by examiner

*Primary Examiner* — Duy Vu N Deo
(74) *Attorney, Agent, or Firm* — Kilpatrick Townsend & Stockton LLP

(57) ABSTRACT

Exemplary integrated cluster tools may include a factory interface including a first transfer robot. The tools may include a wet clean system coupled with the factory interface at a first side of the wet clean system. The tools may include a load lock chamber coupled with the wet clean system at a second side of the wet clean system opposite the first side of the wet clean system. The tools may include a first transfer chamber coupled with the load lock chamber. The first transfer chamber may include a second transfer robot. The tools may include a second transfer chamber coupled with the first transfer chamber. The second transfer chamber may include a third transfer robot. The tools may include a metal deposition chamber coupled with the transfer chamber.

11 Claims, 3 Drawing Sheets

INTEGRATEAD WET CLEAN FOR BEVEL TREATMENTS

CROSS-REFERENCE TO RELATED APPLICATIONS

This application claims priority to U.S. Application Ser. No. 63/224,580, filed Jul. 22, 2021, which is incorporated here by reference.

TECHNICAL FIELD

The present technology relates to semiconductor processing and materials. More specifically, the present technology relates to cluster tool configurations having wet clean systems and methods performed on cluster tools with wet clean systems.

BACKGROUND

Integrated circuits are made possible by processes which produce intricately patterned material layers on substrate surfaces. Producing patterned material on a substrate requires controlled methods for deposition and removal of materials. Metal deposition may be performed in any number of semiconductor processes. As device designs become more complex, many additional operations may be performed, and producing high quality layers of material may be challenging.

Thus, there is a need for improved systems and methods that can be used to produce high quality devices and structures. These and other needs are addressed by the present technology.

SUMMARY

Exemplary integrated cluster tools may include a factory interface including a first transfer robot. The tools may include a wet clean system coupled with the factory interface at a first side of the wet clean system, and may include wet clean systems configured for edge and/or bevel cleaning. The tools may include a load lock chamber coupled with the wet clean system at a second side of the wet clean system opposite the first side of the wet clean system. The tools may include a first transfer chamber coupled with the load lock chamber. The first transfer chamber may include a second transfer robot. The tools may include a second transfer chamber coupled with the first transfer chamber. The second transfer chamber may include a third transfer robot. The tools may include a metal deposition chamber coupled with the transfer chamber.

In some embodiments, the transfer chamber may be a second transfer chamber. The integrated cluster tool may include a first transfer chamber coupled between the load lock chamber and the second transfer chamber. The tool may include a dry etch chamber coupled with the first transfer chamber. The wet clean system may include a single-wafer wet clean chamber operably maintained at atmospheric pressure. The transfer chamber may be maintained at vacuum conditions. The single-wafer wet clean chamber may be accessible to the first transfer robot of the factory interface. The wet clean system may include a fourth transfer robot disposed in the wet clean system. The fourth transfer robot may be operable to transfer substrates between the single-wafer wet clean chamber and the load lock chamber. The wet clean system may include two or more vertically stacked, single-wafer wet clean chambers. Each single-wafer wet clean chamber may be fluidly coupled with a plurality of chemistry delivery systems. A track on which the first transfer robot operates may extend into the wet clean system. The tool may include a deposition chamber operable to deposit a capping layer. The deposition chamber may be coupled with the transfer chamber.

Some embodiments of the present technology may encompass methods of processing a substrate. The methods may include forming one or more layers of metal-containing materials on a substrate. The forming may occur in a metal deposition chamber. The methods may include transferring the substrate from the metal deposition chamber to a load lock chamber. The methods may include delivering the substrate from the load lock chamber to a wet clean system coupled with the load lock chamber on a surface of the wet clean system. The methods may include processing the substrate in a wet clean chamber of the wet clean system to remove metal from an edge region of the substrate. The methods may include delivering the substrate from the wet clean system to the load lock chamber. The methods may include delivering the substrate from the load lock chamber to a deposition chamber. The methods may include forming a capping layer on the substrate.

In some embodiments, the capping layer may extend into the edge region of the substrate and extend directly over metal of the one or more layers of metal-containing materials. Processing the substrate in the wet clean chamber may include wet etching one or more of the one or more layers of metal-containing materials on a substrate to fully remove a material from an edge region of the substrate. The one or more layers of metal-containing materials may include multiple layers of metal-containing materials. Processing the substrate in the wet clean chamber may include removing one or more of the one or more layers of metal-containing materials on the substrate. Processing the substrate in the wet clean chamber may include at least partially maintaining one of the one or more layers of metal-containing materials on the substrate. The methods may include, prior to delivering the substrate to the deposition chamber, performing a dry etch process on the substrate to remove oxidation from exposed metal on the substrate. The methods may include performing a vacuum purge operation in the load lock chamber after processing the substrate in the wet clean chamber. The methods may include performing a vacuum purge operation in the deposition chamber prior to forming the capping layer on the substrate. The wet clean system may be maintained at atmospheric conditions. The metal deposition chamber and the deposition chamber may be maintained at vacuum conditions.

Some embodiments of the present technology may encompass methods of processing a substrate. The methods may include forming one or more layers of metal-containing materials on a substrate. The forming may occur in a metal deposition chamber. The methods may include transferring the substrate from the metal deposition chamber to a load lock chamber. The methods may include delivering the substrate from the load lock chamber to a wet clean system coupled with the load lock chamber on a surface of the wet clean system. The methods may include processing the substrate in a wet clean chamber of the wet clean system to remove metal from an edge region of the substrate. The methods may include delivering the substrate from the wet clean system to the load lock chamber. The methods may include delivering the substrate to a dry etch chamber. The methods may include performing a dry etch process on the substrate to remove oxidation from exposed metal on the substrate. The methods may include delivering the substrate from the dry etch chamber to a deposition chamber. The methods may include forming a capping layer on the substrate.

In some embodiments, the methods may include performing a vacuum purge operation in the load lock chamber after processing the substrate in the wet clean chamber. Processing the substrate in the wet clean chamber may include wet etching one or more of the one or more layers of metal-containing materials on a substrate to fully remove a material from an edge region of the substrate.

Such technology may provide numerous benefits over conventional systems and techniques. For example, the present technology may protect fragile metal deposition from exposure in capping layer removal. Additionally, the present technology may efficiently process substrates by performing material removal on edge regions of a substrate prior to capping the material on the substrate. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
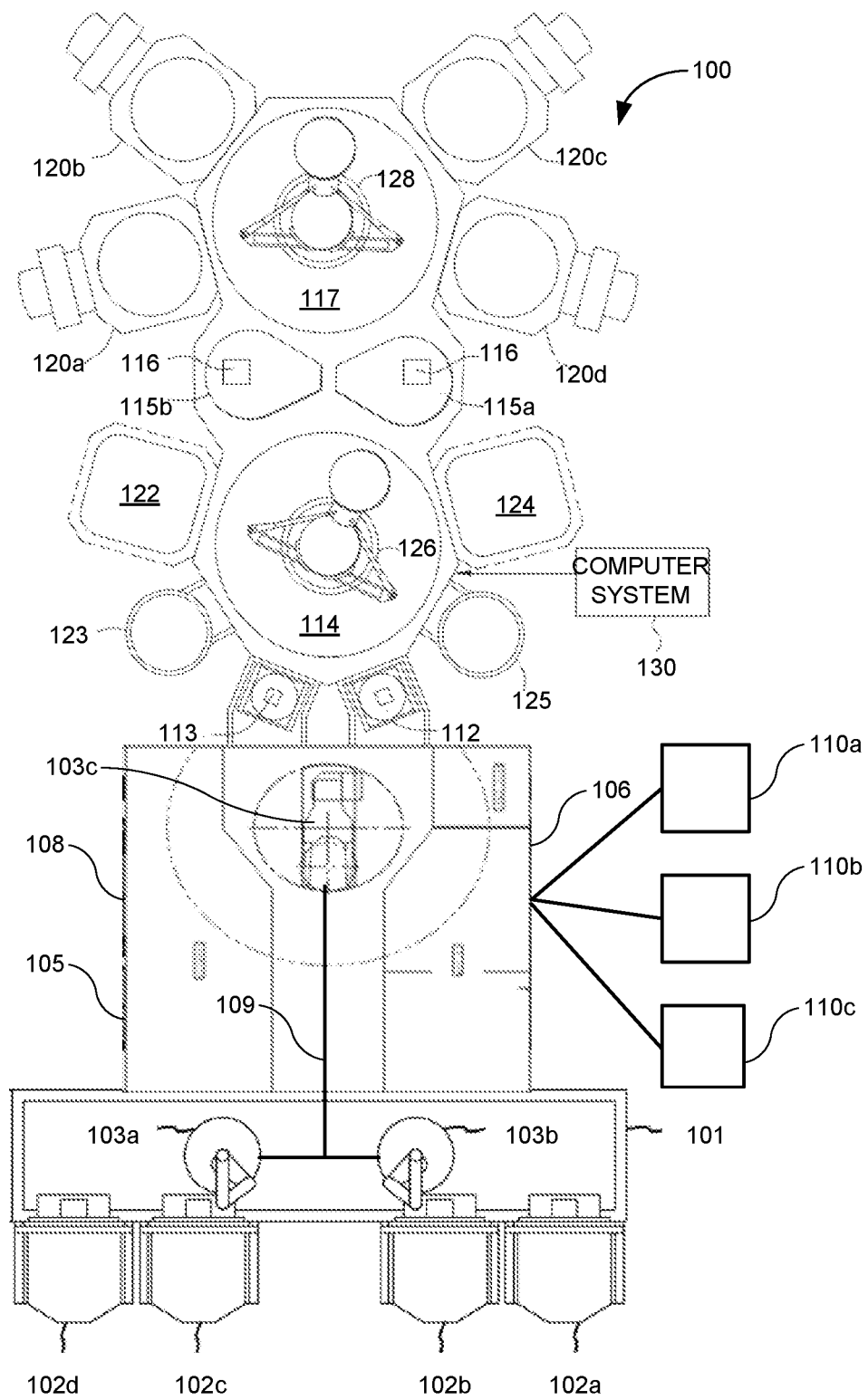
FIG. 1 shows a schematic top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Semiconductor processing includes metal deposition operations at any number of locations in a structure. As processing becomes more complex, critical dimensions of metal aspects of a structure may continue to shrink. Additionally, many structural formations are produced further on a substrate towards the bevel. Due to the proximity of many structures or devices to the bevel or edge regions of a substrate, metal deposition may extend out into the edge region, which may be the last few radial millimeters of a substrate, and deposition may extend onto the bevel.

Bevel cleaning operations are often performed in separate tools from the processing, and are used to remove material formed in the edge region. Bevel cleaning may remove defects that are often prevalent at far edge regions where metal deposition may end, or where uniformity of formation may be compromised. If left unchecked, these issues may cause film peeling, which may lead to device scrapping or failure. However, when metal deposition processes are performed leading to a bevel clean, before the transfer to the etch system, a capping layer is often deposited over the metal. The capping layer may be formed for a number of reasons, such as to prevent oxidation on the metal, or to operate as an anti-reflective coating during subsequent lithography, for example. The edge removal may then be frustrated due to the overlying capping layer. To re-expose the metal at the edge region, conventional technologies often perform a removal of the capping layer at the edge, which may utilize plasma etching or wet chemicals. This increases the process steps, and may impact the integrity of the materials. For example, controlling the removal of the capping layer may be difficult, and may lead to over etch. Additionally, the selectivity of the capping material removal to the underlying metal may be insufficient, and the metal may be damaged in device regions. Finally, for multi-layer metal structures, metal filaments may extend from the capping layer, which may be fragile, and tend to fracture, causing internal damage to the structures.

The present technology may overcome these issues by utilizing a tool and process sequence that incorporate a wet clean system. By incorporating the wet clean system on a cluster tool, an edge removal may be performed prior to forming a capping layer. This may prevent the need for removal of the capping layer whether by plasma or by wet chemistry, and may allow an improved capping layer to be formed. For example, once the metal edge material is removed, the substrate may be returned to a vacuum environment for a subsequent formation of the capping layer. This subsequent formation may allow the capping layer to fully cover edges of the metal, and better protect the formed layers. This may provide a more cost-effective process including less operations, while also producing coverage with greater integrity proximate edge regions. Although the remaining disclosure will routinely identify specific materials and processes utilizing the disclosed technology, it will be readily understood that the systems and methods are equally applicable to a variety of materials and processes as may occur during deposition or other semiconductor processing. Accordingly, the technology should not be considered to be so limited as for use with bevel cleaning alone. After discussing an exemplary chamber system that may be used according to some embodiments of the present technology, methods of semiconductor processing that may occur on the systems will be described.

FIG. 1 illustrates a schematic top plan view of an integrated cluster tool, or multi-chamber processing system 100, which may be specifically configured to implement aspects or operations according to some embodiments of the present technology. The multi-chamber processing system 100 may be configured to perform one or more fabrication processes on individual substrates, such as any number of semiconductor substrates, for forming semiconductor devices. The multi-chamber processing system 100 may include components that may be maintained at atmospheric pressure, which may be any pressure within a processing facility, such as including positive or negative pressure environments. The system may also include components that are maintained under vacuum conditions, and which may be separated from the atmospheric components by a load lock system, for example.

Multi-chamber processing system 100 may include a factory interface 101, which may include receptacles along a first side of the unit to receive one or more front-opening unified pods, or FOUPs 102, for providing substrates to the system for processing. Although four FOUPs are illustrated as being coupled with the system, in some embodiments, one, two, three, four, or more FOUPs may be connected at any time. Each FOUP 102 may include one or more substrates for processing. Because FOUPs typically store several substrates for processing, conventional technologies often have large time delays between processing between tools. Each tool may process dozens of substrates as a batch, prior to transferring all substrates to the next tool. This may increase time delay, and for metal layers formed on substrates, this time delay may lead to increased oxidation or aging.

Factory interface 101 may include one or more transfer robots 103, which may be operated to move laterally within the factory interface, and access any of the FOUPs. Opposite the side of the factory interface on which the FOUPs may be coupled may be a wet clean system 105, which may include one or more wet clean chambers 106, such as including one or more wet clean chambers configured to edge cleaning and/or bevel cleaning. The wet clean system 105 may be coupled with the factory interface along a first side or surface of the wet clean system as shown, and may be accessible by one or more transfer robots 103. For example, in some embodiments, factory interface transfer robots 103a or 103b may be used to receive substrates from a FOUP connected to the factory interface, and may also be used to deliver substrates to the wet clean chamber 106. The factory interface transfer robots may also be used to deliver substrates to one or more load lock chambers 112, which may be coupled with the wet clean system 105 at a second side or surface of the wet clean system, such as the side opposite where the wet clean system is coupled with the factory interface 101.

In some embodiments, an additional transfer robot 103c may be included in the wet clean system, and may work with or in lieu of the factory interface transfer robots. For example, in some embodiments the factory interface transfer robot may deliver the substrate into the wet clean chamber 106, and the wet clean system transfer robot 103c may deliver the substrates from the wet clean chamber 106 to the load lock chambers 112. Additionally, the wet clean system transfer robot may receive substrates from the factory interface, and may deliver to and from the wet clean chamber 106. In some embodiments a track 109 on which the robots may be moved may extend through both the factory interface and the wet clean system to facilitate one or more robots being operable to receive and deliver substrates among the system components. Any of the noted transfer robots may move along any aspect of the track in some embodiments of the present technology.

Wet clean system 105 may include a number of components and chambers for processing substrates. For example, wet clean hardware 108 may be included in the system to facilitate operations as will be explained further below. Wet clean chamber 106 may be one or more chambers in embodiments of the present technology. For example, wet clean chamber 106 may include a batch cleaning bath or system, and may be or include one or more single-wafer wet clean chambers in some embodiments. Single-wafer wet clean chambers may be stacked in some embodiments, as will be explained below, which may allow individual processes to be performed in each chamber, or may allow multiple substrates to be processed simultaneously, for example. The chambers may be fluidly coupled with one or more chemistry delivery systems 110, which may include pumps, tubing, and other materials for delivering one or more process chemistries to the one or more wet clean chambers 106.

Any number of wet clean processes may be performed according to aspects of the present technology, and in some embodiments the wet cleaning may include multiple cleaning processes and chemistries. For example, the present technology may include performing a bevel clean and scrub, or edge removal operation, subsequent to one or more layers of metal deposition on a substrate. In some embodiments a first chemistry delivery system 110a may provide a first chemistry. A second chemistry delivery system 110b may provide a second chemistry. A third chemistry delivery system 110c may provide a third chemistry. Any number of additional chemistry delivery systems may also be included in embodiments encompassed by the present technology. Chemistry delivery systems may include any number of chemistries that may facilitate removal at the bevel and edge region of the substrate. For example, chemistries may include heated nitric acid, heated phosphoric acid, or combinations such as a solution of phosphoric acid, acetic acid, and nitric acid. The solutions may be used to etch any number of metals, and may be used to limit interaction with dielectric layers that may also be exposed in the regions for removal. Additionally, etching may be performed utilizing strong bases, which may etch dielectric materials as well.

Although any number of solutions may be used, in some embodiments solutions may be characterized by increased strength to facilitate complete removal during etching and scrubbing operations. For example, a combination of ammonium hydroxide and hydrogen peroxide diluted in deionized water may be characterized by a reduced dilution, such as 1:2:10, 1:1:5, or less, to increase the ease of removal. It is to be understood that the chemistries may come from one or more fluid sources and be delivered to one or more wet clean chambers. Additionally, although shown separate from the wet clean system 105 for ease of explanation, it is to be understood that the fluid delivery systems may be included with the system, such as being part of the clean hardware section of the system, for example. Once cleaning operations have been performed, substrates may be delivered into load lock chambers 112, which may transfer the substrates to a vacuum environment for processing. By being able to transfer from the vacuum environment and to the vacuum environment, the time during which metal layers may be exposed after processing may be limited. This may reduce the extent of oxidation that may occur.

As explained above, wet clean chamber 106 may be maintained at atmospheric pressure, or a common pressure with the facilities environment. Multi-chamber processing system 100 may also include a number of components at vacuum conditions. For example, load lock chambers 112 may be used to transfer substrates to and from a vacuum environment coupled on the opposite sides of the load lock chambers from the wet clean system. Although single-wafer load locks are illustrated, it is to be understood that dual-wafer or multi-wafer load locks may also be used in systems according to embodiments of the present technology. Once substrates are delivered to the load lock chambers, vacuum conditions may be enacted, as well as one or more other process operations. Because wet cleaning as will be described further below may remove a number of contaminant materials, a controlled environment may then be employed for further processing. Along with providing vacuum pressures, load lock chambers 112 may perform additional operations, such as purging and heating. For example, load lock chambers 112 may be purged with nitrogen, argon, or some other inert or non-reactive gas, which may limit contaminant incorporation or oxide formation on the surface of the substrate. Additionally, a heating operation may be performed, which may ensure moisture is removed or prevented from contacting the substrate, while maintaining thermal budgets of the substrate. For example, the load lock chamber may heat the substrate to temperatures that are less than or about 400° C., less than or about 300° C., less than or about 200° C., less than or about 100° C., or less. Additional moisture removal operations may include pump-down operations and purging from the load lock chambers, which may further remove residual moisture prior to forming a capping layer.

Once the substrate is ready for further processing, or the substrate is received in the queue, further processing within the system may occur. The multi-chamber processing system 100 may include transfer chambers for providing the substrate to any number of locations on the system. For example, a first transfer chamber 114 may be coupled with the load lock chambers 112 as illustrated, and may receive a substrate for further processing. About the first transfer chamber may be any number of processing chambers, which may be used to perform any number of processes on the substrate. Although the remaining discussion will involve chambers involved in preparation for, or performance of, metal deposition and capping, it is to be understood that any number of other processing chambers may be included on the system. For example, chambers 123 and 125 may be used for pre-heating, metrology, orientation, or any number of other operations that may be performed in semiconductor processing. Substrates may then be delivered into processing chambers 122, 124, which may be configured to perform an optional etch process. Any number of etch processes may be performed, such as a process for removing native oxide that may have formed on the exposed metal once transferred from the load lock into the wet clean system to perform the edge removal operation. The etch processes may include plasma or non-plasma processes, and may be any number of dry etch processes according to embodiments of the present technology.

After optional dry etch processing, substrates may be transferred to additional processing chambers 120, one of which may be used to perform a deposition operation, such as for a capping layer, while one or more of chambers 120 may be used to perform metal deposition. A second transfer chamber 117 may be coupled with first transfer chamber 114, and may be used to deliver substrates to and from the deposition chambers in some embodiments. As will be explained in further detail below, each of the processing chambers 120a, 120b, 120c, and 120d may be configured similarly or differently, depending on the processing to be performed. For example, chambers may be configured to form a capping layer on previously deposited materials, and additional chambers may be configured to perform deposition of metal or metal-containing materials.

In some embodiments, the metal deposition may be performed, followed by delivery from the vacuum sections to the wet clean system for edge removal. The substrates may then be passed back into the vacuum side for deposition of a capping layer. Delivery between the first transfer chamber 114 and the second transfer chamber 117 may be facilitated with transfer robots within the chambers. Two substrate transfer platforms 115 may be disposed between transfer chamber 114 and transfer chamber 117, and may facilitate transfer between robots 126 and 128. The transfer platforms 115a and 115b may be open to the transfer chambers, which may also be buffer chambers, or the platforms may be selectively isolated or sealed from the chambers to allow different operational pressures to be maintained between the two transfer chambers, for example. Transfer platforms 115 may each include one or more tools 116, such as for orientation or measurement operations, in some embodiments of the present technology.

The operation of the multi-chamber processing system 100 may be controlled by a computer system 130. The computer system 130 may include any device or combination of devices configured to implement the operations described below. Accordingly, the computer system 130 may be a controller or array of controllers and/or a general purpose computer configured with software stored on a non-transitory, computer-readable medium that, when executed, may perform the operations described in relation to methods according to embodiments of the present technology. Each of the processing chambers and wet clean system may be configured to perform one or more process operations in the fabrication of a semiconductor structure. More specifically, the processing chambers may be outfitted to perform a number of additional substrate processing operations that may include dry etch processes, cyclical layer deposition, atomic layer deposition, chemical vapor deposition, physical vapor deposition, etch, pre-clean, degas, orientation, among any number of other substrate processes.

Figure 2:
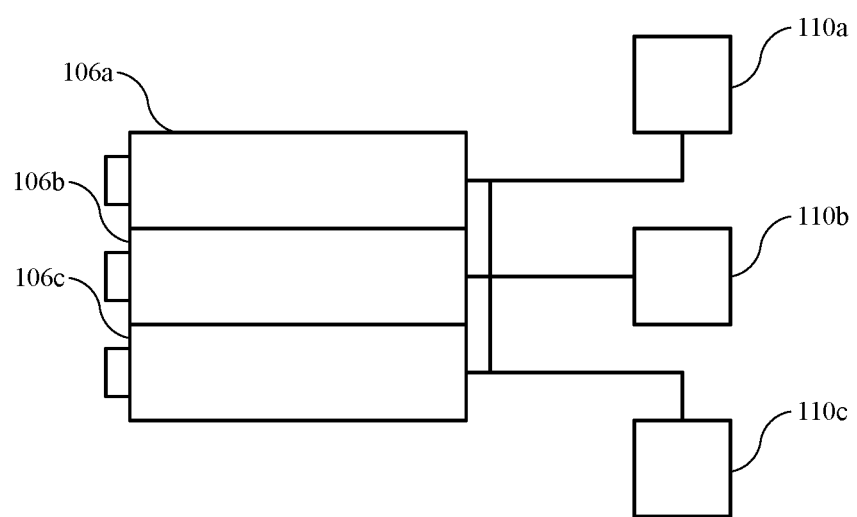
FIG. 2 shows a schematic cross-sectional view of stacked wet clean chambers according to some embodiments of the present technology.

As explained previously, wet clean chamber 106 may include multiple single-wafer wet clean chambers in some embodiments of the present technology. FIG. 2 shows a schematic cross-sectional view of stacked wet clean chambers according to some embodiments of the present technology. As illustrated, two or more wet clean chambers 106 may be stacked vertically, which may limit the length of the integrated cluster tool in some embodiments of the present technology. The chambers may be stacked on one another, and may be accessible to any of the transfer robots. Additionally, because wet clean chambers may be accessed at an angle, as opposed to only by straight-on delivery, the chambers may readily be accessed by the different transfer robots as previously described, without requiring additional modification of the transfer robots.

As explained previously, processing according to some embodiments of the present technology may include performing multiple wet clean operations, which may facilitate removal of a number of materials, including metal or metal-containing materials, on edge regions of the substrate. In some embodiments, different wet clean chambers may be utilized to perform different cleaning operations, such as for removal of different metals or other materials extending into an edge region of the substrate. Additionally, while general purpose cleaning or etching wet chambers may be included, in some embodiments one or more cleaning chambers may be included, and which are configured specifically to perform edge region or bevel etching. For example, wet clean chamber 106a, may be coupled with chemistry delivery system 110a, which may include chemistry for performing a first wet clean, wet clean chamber 106b, may be coupled with chemistry delivery system 110b, which may include chemistry for performing a second wet clean, and wet clean chamber 106c, may be coupled with chemistry delivery system 110c, which may include chemistry for performing a third wet clean. Additionally, as illustrated, each wet clean chamber 106 may be fluidly coupled with each of the chemistry delivery systems 110, which may allow each wet clean chamber to perform a number of cleaning operations as will be described below.

Although three stacked wet clean chambers 106 are illustrated, it is to be understood that in embodiments of the present technology wet clean systems may include a single wet clean chamber, or may include stacked or otherwise oriented clean chambers, including two or more, such as three, four, five, or more wet clean chambers according to embodiments of the present technology. In some embodiments, each etch chamber may be specifically configured to perform edge exposure on the substrate to cleaning agents or scrubbing, and in some embodiments the chambers may limit exposure to etchants of any region of the substrate except the edge region. For example, etchant delivery may occur from below the substrate, and may be allowed or distributed to flow up about the bevel region. The delivery may be extended into an edge region of the substrate, which may be less than or about 5 mm inward from the radial edge, and may be less than or about 4 mm, less than or about 3 mm, less than or about 2 mm, less than or about 1 mm, or less.

Figure 3:
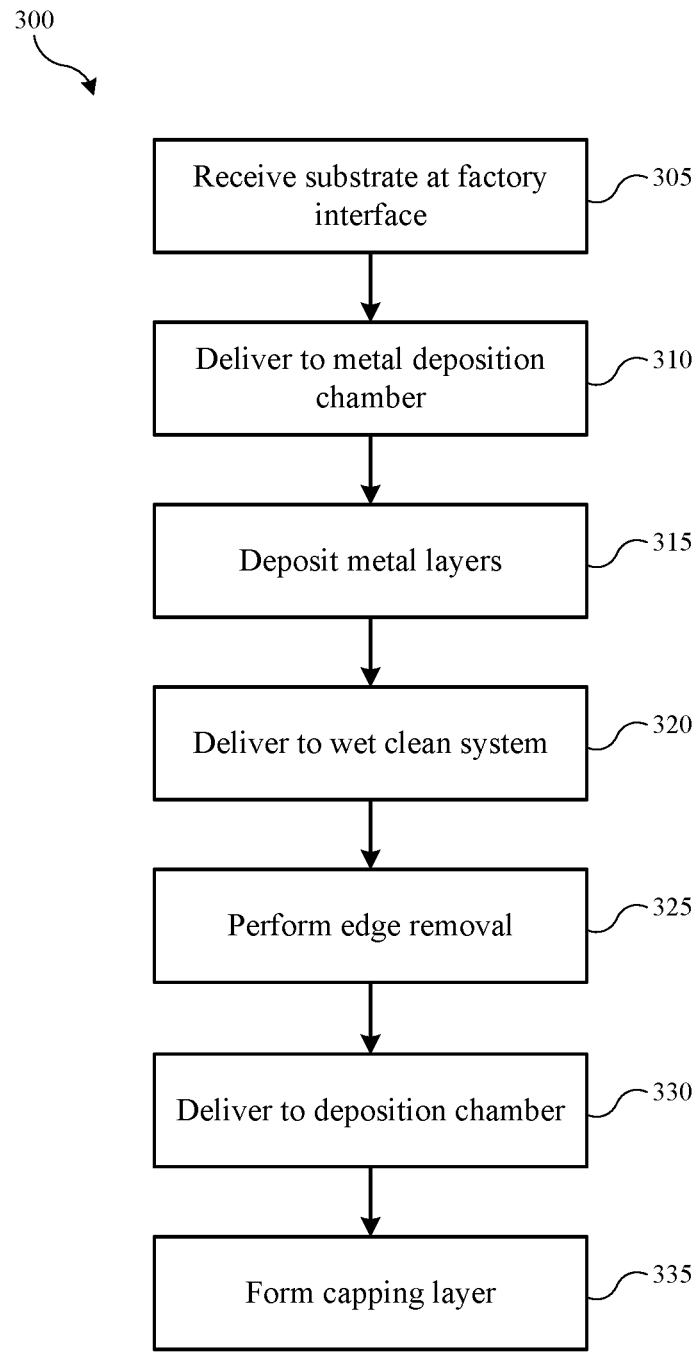
FIG. 3 shows selected operations in a method of processing a substrate according to some embodiments of the present technology.

Turning to FIG. 3 is illustrated selected operations in a method 300 of processing a substrate according to some embodiments of the present technology. Method 300 may include one or more operations prior to the initiation of the method, including front end processing, deposition, etching, polishing, cleaning, or any other operations that may be performed prior to the described operations. For example, in some embodiments a semiconductor structure may be developed on which metal deposition, including selective metal deposition, may be performed. As one non-limiting example, a memory structure may be developed to a point where one or more layers of metal may be deposited. Any number of other structures may similarly be produced to a point where metal deposition may be desired, such as on silicon or silicon-containing materials. The method may include a number of optional operations, which may or may not be specifically associated with some embodiments of methods according to the present technology. For example, many of the operations are described in order to provide a broader scope of the structural formation, but are not critical to the technology, or may be performed by alternative methodology as will be discussed further below.

Method 300 may involve receiving a substrate at a factory interface of an integrated cluster tool at operation 305, such as integrated multi-chamber processing system 100 described above. The substrate may be removed from a FOUP by a transfer robot into the tool environment. In some embodiments, one or more wet clean operations may be performed in the wet clean station coupled between the factory interface and the load lock chambers, although in some embodiments substrates may be delivered through the wet clean system to the load lock chamber. The load lock chamber may provide access to a vacuum environment in which any number of etch or deposition operations may be performed. At operation 310, the substrate may be delivered to one or more metal deposition chambers, which may be used to deposit one or more layers of metal on a substrate at operation 315. The metal may include any number of depositions including reactive sputtering, metal-organic chemical vapor deposition, or any other metal deposition technique. The metal may be deposited in blankets or onto selected surfaces, and may be characterized by any shape or critical dimension between features. Once the metal deposition operations have completed, the substrate may be delivered back to the load lock chambers. The substrate may be delivered from the load lock, and from the vacuum environment, into the wet clean system at operation 320. The delivery may be directly into the wet clean system, which may be coupled to the load lock chambers as previously described. For example, a transfer robot that may remove the substrate from the load lock chamber and directly load the substrate into the wet clean system, as previously described.

Once the substrate is received in the wet clean system, an edge removal operation may be performed, as previously described. For example, one or more metal layers, and/or any other materials exposed in the edge region may be removed or wet etched and scrubbed from the edge region of the substrate at operation 325. In some embodiments, the metal materials, such as each metal layer, may be removed from the substrate at the edge and/or bevel region. Additionally, one or more layers of metal may be removed, while one or more layers may be at least partially maintained. As one non-limiting example, at least one layer of metal material may be partially maintained on the substrate, which may provide a contact or additional electrical coupling location. After the edge removal and/or scrubbing operations have been performed, one or more drying operations may be performed. For example, the substrate may be dried in a spin dry process. Additionally, the chamber may perform more involved drying operations. For example, the cleaned wafer to be dried may be horizontally rotated, and a moveable arm containing two fluid delivery nozzles may be brought to the center of the wafer. The leading nozzle may contain deionized water delivered across the wafer, and the trailing nozzle may contain alcohol, or an $N_2$/tensioactive vapor dispense, for example. The arm then may be moved from the center of the wafer to the edge of the spinning wafer, drying the wafer in a way to limit or prevent development of water marks. Additionally, in some embodiments, a surface modification drying operation may be performed, which may cause silylation reactions that dry the surface on which growth is to be performed. As explained above, different operations may be performed in any number of wet clean chambers. In some embodiments, each of the processes may be performed in a single-wafer wet clean chamber, including the drying operation.

Once the wet etching has been completed, the substrate may be delivered directly back into the load lock chamber. Although drying operations may be performed during the wet etch processing, an amount of moisture may still be incorporated with the substrate. Accordingly, in some embodiments the load lock chamber may perform a pump-purge operation or a heating operation to allow vapor outgassing, and drying of the substrate. From the load lock chamber, the substrate may be further processed in any number of ways. For example, in some embodiments a dry etch process may be performed, which may include a plasma etching process, for example. The plasma or dry etch process may be performed to remove oxidation that may have formed on the exposed metal layers during the wet clean system processing, where the substrate may be exposed to atmospheric conditions. Depending on the capping layer to be later formed, the processing may not remove oxide, which may facilitate formation or nucleation of capping layer materials. Capping layer materials may also include oxide, which may then reduce the need for an oxide-free surface. Additionally, processing may include delivering the substrate to one or more deposition chambers at operation 330, where a capping layer may be formed at operation 335.

Capping layer deposition may include formation of any number of dielectric or metal materials, which may be performed as a blanket deposition or as a conformal formation, and may include capping layers formed in many types of semiconductor processing. Based on the previous edge removal, the capping layer may directly contact the one or more metal-containing layers across the substrate. The one or more metal-containing layers may be removed at the edge region as previously explained, and the capping layer may extend beyond an exterior edge of the remaining metal-containing materials, and extend into the edge region. Consequently, the capping layer may fully cover the metal-containing materials, which have already been recessed from an edge region of the substrate. By performing processes encompassed by the present technology, improved capping may be formed over metal materials that have already been removed at edge regions of the substrate. Additionally, based on the significantly reduced time between wet cleaning and introduction to a vacuum environment, the present technology may improve uniformity of processing wafer to wafer.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either limit of the range, both limits of the range, or neither limit of the range are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the chamber" includes reference to one or more chambers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of processing a substrate, the method comprising:
    forming one or more layers of metal-containing materials on a substrate, wherein the forming occurs in a metal deposition chamber;
    transferring the substrate from the metal deposition chamber to a load lock chamber;
    delivering the substrate from the load lock chamber to a wet clean system coupled with the load lock chamber on a surface of the wet clean system;
    processing the substrate in a wet clean chamber of the wet clean system to remove metal from an edge region of the substrate;
    delivering the substrate from the wet clean system to the load lock chamber;
    delivering the substrate from the load lock chamber to a deposition chamber; and
    forming a capping layer on the substrate.

2. The method of processing a substrate of claim 1, wherein the capping layer extends into the edge region of the substrate and extends directly over metal of the one or more layers of metal-containing materials.

3. The method of processing a substrate of claim 1, wherein processing the substrate in the wet clean chamber comprises:
    wet etching one or more of the one or more layers of metal-containing materials on a substrate to fully remove a material from an edge region of the substrate.

4. The method of processing a substrate of claim 1, wherein the one or more layers of metal-containing materials include multiple layers of metal-containing materials, and wherein processing the substrate in the wet clean chamber comprises:
    removing one or more of the one or more layers of metal-containing materials on the substrate; and
    at least partially maintaining one of the one or more layers of metal-containing materials on the substrate.

5. The method of processing a substrate of claim 1, further comprising:
    prior to delivering the substrate to the deposition chamber, performing a dry etch process on the substrate to remove oxidation from exposed metal on the substrate.

6. The method of processing a substrate of claim 1, further comprising:
    performing a vacuum purge operation in the load lock chamber after processing the substrate in the wet clean chamber.

7. The method of processing a substrate of claim 1, further comprising:
    performing a vacuum purge operation in the deposition chamber prior to forming the capping layer on the substrate.

8. The method of processing a substrate of claim 1, wherein the wet clean system is maintained at atmospheric conditions, and wherein the metal deposition chamber and the deposition chamber are maintained at vacuum conditions.

9. A method of processing a substrate, the method comprising:
    forming one or more layers of metal-containing materials on a substrate, wherein the forming occurs in a metal deposition chamber;
    transferring the substrate from the metal deposition chamber to a load lock chamber;

delivering the substrate from the load lock chamber to a wet clean system coupled with the load lock chamber on a surface of the wet clean system;

processing the substrate in a wet clean chamber of the wet clean system to remove metal from an edge region of the substrate;

delivering the substrate from the wet clean system to the load lock chamber;

delivering the substrate to a dry etch chamber;

performing a dry etch process on the substrate to remove oxidation from exposed metal on the substrate;

delivering the substrate from the dry etch chamber to a deposition chamber; and forming a capping layer on the substrate.

10. The method of processing a substrate of claim 9, further comprising:

performing a vacuum purge operation in the load lock chamber after processing the substrate in the wet clean chamber, wherein forming the one or more layers of metal-containing materials on the substrate is performed in a vacuum formed in the load lock chamber.

11. The method of processing a substrate of claim 9, wherein processing the substrate in the wet clean chamber comprises:

wet etching one or more of the one or more layers of metal-containing materials on a substrate to fully remove a material from an edge region of the substrate.

\* \* \* \* \*